United States Patent
Pelley (10) Patent No.: US 8,861,289 B2
(45) Date of Patent: *Oct. 14, 2014

(54) MULTIPORT MEMORY WITH MATCHING ADDRESS CONTROL

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/740,868

(22) Filed: Jan. 14, 2013

(65) Prior Publication Data

US 2014/0198590 A1   Jul. 17, 2014

(51) Int. Cl.
| | | |
|---|---|---|
| G11C 7/00 | (2006.01) | |
| G11C 8/16 | (2006.01) | |
| G11C 7/10 | (2006.01) | |

(52) U.S. Cl.
CPC .. *G11C 8/16* (2013.01); *G11C 7/00* (2013.01); *G11C 7/10* (2013.01)
USPC ..................... 365/189.14; 365/205

(58) Field of Classification Search
CPC .......................... G11C 13/0069; G11C 13/4091
USPC ............................. 365/189.14, 205
See application file for complete search history.

(56) References Cited

U.S. PATENT DOCUMENTS

| | | | | |
|---|---|---|---|---|
| 5,335,199 | A | * | 8/1994 | Aoyama ................... 365/230.05 |
| 5,384,734 | A | * | 1/1995 | Tsujihashi et al. ........ 365/189.04 |
| 6,044,034 | A | * | 3/2000 | Katakura ................ 365/230.05 |
| 6,181,634 | B1 | | 1/2001 | Okita |
| 6,473,357 | B1 | | 10/2002 | Fan et al. |
| 6,625,699 | B2 | | 9/2003 | Cohen et al. |
| 6,816,955 | B1 | | 11/2004 | Raza et al. |
| 6,845,059 | B1 | | 1/2005 | Wordeman et al. |
| 6,873,565 | B1 | | 3/2005 | Riedlinger et al. |
| 6,909,662 | B2 | * | 6/2005 | Sugiyama ................ 365/230.05 |

(Continued)

FOREIGN PATENT DOCUMENTS

FR   2976114 A1   12/2012

OTHER PUBLICATIONS

U.S. Appl. No. 13/483,764, Pelley, P.H., et al., "Multi-Port Register File with Multiplexed Data", filed May 30, 2012.

(Continued)

*Primary Examiner* — Michael Tran
(74) *Attorney, Agent, or Firm* — James L. Clingan, Jr.; Joanna G. Chiu (57) ABSTRACT

In a multiple port SRAM, a first bit cell is coupled to first and second word lines and a first and second bit line pair. A second bit cell is coupled to the first and second word lines and a third and fourth bit line pair. A first data line pair is coupled to the first bit line pair via first switching logic and to the third bit line pair via second switching logic, and a second data line pair is coupled to the second bit line pair via third switching logic and to the fourth bit line pair via fourth switching logic. If a match exists between at least portions of a first and second access address, a state of the third and forth switching logic is set such that the second bit line pair and the fourth bit line pair remains decoupled from the second data line pair.

20 Claims, 3 Drawing Sheets

(56) References Cited

U.S. PATENT DOCUMENTS

| | | |
|---|---|---|
| 7,054,217 B2 | 5/2006 | Yamada |
| 7,206,251 B1 | 4/2007 | Yu |
| 7,533,222 B2 | 5/2009 | Leung |
| 7,573,753 B2 | 8/2009 | Atwood et al. |
| 7,808,847 B2 | 10/2010 | Wang et al. |
| 7,894,296 B2 | 2/2011 | Lee et al. |
| 7,940,599 B2 | 5/2011 | Lu et al. |
| 2005/0270885 A1 | 12/2005 | Masuo |
| 2008/0159051 A1 | 7/2008 | Kato |
| 2011/0255361 A1 | 10/2011 | Russell et al. |
| 2012/0051151 A1 | 3/2012 | Wu et al. |

OTHER PUBLICATIONS

Endo, K., et al., "Pipelined, Time-Sharing Access Technique for an Integrated Multiport Memory", IEEE Journal of Solid-State Circuits, vol. 26, No. 4, Apr. 1991, pp. 549-554.

Johnston, C.T., et al., "FPGA implementation of a Single Pass Connected Components Algorithm", 4th IEEE International Symposium on Electronic Design, Test & Applications, May 2008, pp. 228-231.

Nii, K., et al., "Synchronous Ultra-High-Density 2RW Dual-Port 8T-SRAM with Circumvention of Simultaneous Common-Row-Access", IEEE Journal of Solid-State Circuits, vol. 44, No. 3, Mar. 2009, pp. 977-986.

Pilo, H., et al., "A 5.6ns Random Cycle 144Mb DRAM with 1.4Gb/s/pin and DDR3-SRAM Interface", ISSCC 2003/Session 17/SRAM and DRAM/Paper 17.5, IEEE International Solid-State Circuits Conference, Feb. 12, 2003, 11 pgs.

EP Application 14150651.9-1806, Extended Search Report mailed May 12, 2014.

EP Application 14150645.1-1806, Extended Search Report, mailed May 12, 2014.

* cited by examiner

MULTIPORT MEMORY WITH MATCHING ADDRESS CONTROL

CROSS-REFERENCE TO RELATED APPLICATION

This application is related to U.S. patent application Ser. No. 13/740,862, filed on even date, titled "MULTIPORT MEMORY WITH MATCHING ADDRESS AND DATA LINE CONTROL," naming Perry Pelley as inventor, and assigned to the current assignee hereof.

BACKGROUND

1. Field

This disclosure relates generally to semiconductor devices, and more specifically, to multiport semiconductor memory devices with matching address control.

2. Related Art

Along with recent advancements of semiconductor technologies, smaller-size and larger-capacity memories that allow high-speed reading/writing operations have been developed. Further, a so-called multiport memory including plural input ports and output ports has been used for reading/writing data of different addresses.

Multi-port memories, by providing access to the storage element of memory cells to more than one resource, such as in the case of multi-core processor or an interface between a processor and a bus, have become more commonly used. One of the issues with multi-port memories is how to coordinate this aspect of providing access to more than one resource. Often this ability is achieved using wait states and/or arbitration. This can result in unpredictable access times which is undesirable.

Accordingly there is a need for a multi-port memory that improves upon one or more of the issues discussed above.

BRIEF DESCRIPTION OF THE DRAWINGS

The present disclosure is illustrated by way of example and is not limited by the accompanying figs, in which like reference numbers indicate similar elements. Elements in the figures are illustrated for simplicity and clarity and have not necessarily been drawn to scale.

DETAILED DESCRIPTION

In one aspect, when a bit cell is selected by two ports, a bit line pair of one port is kept decoupled from the storage nodes of the selected memory cell and from its data line pair whereas the bit line pair of the other port is coupled to the storage nodes of the selected memory cell and to its data line pair. Also the selected word line of the one port is kept disabled whereas the selected word line of the other port is enabled. Thus, the capacitance of the bit line pair of the one port is kept from adversely impacting the access to the selected bit cell whereas the bit line pair of the other port provides the needed access. Additionally, bit cell stability issues associated with simultaneous multiport access to a common bit cell are avoided. An access can be a read or a write. The data line pair of the one port is coupled to the data line pair of the other port to ensure that the access to the selected bit cell is effective for both ports. The result is that the access required is achieved for both ports while avoiding the reduction in performance that would have occurred if both bit line pairs had been coupled to the storage nodes of the selected bit cell. This is better understood by reference to the drawings and the following description.

Figure 1:
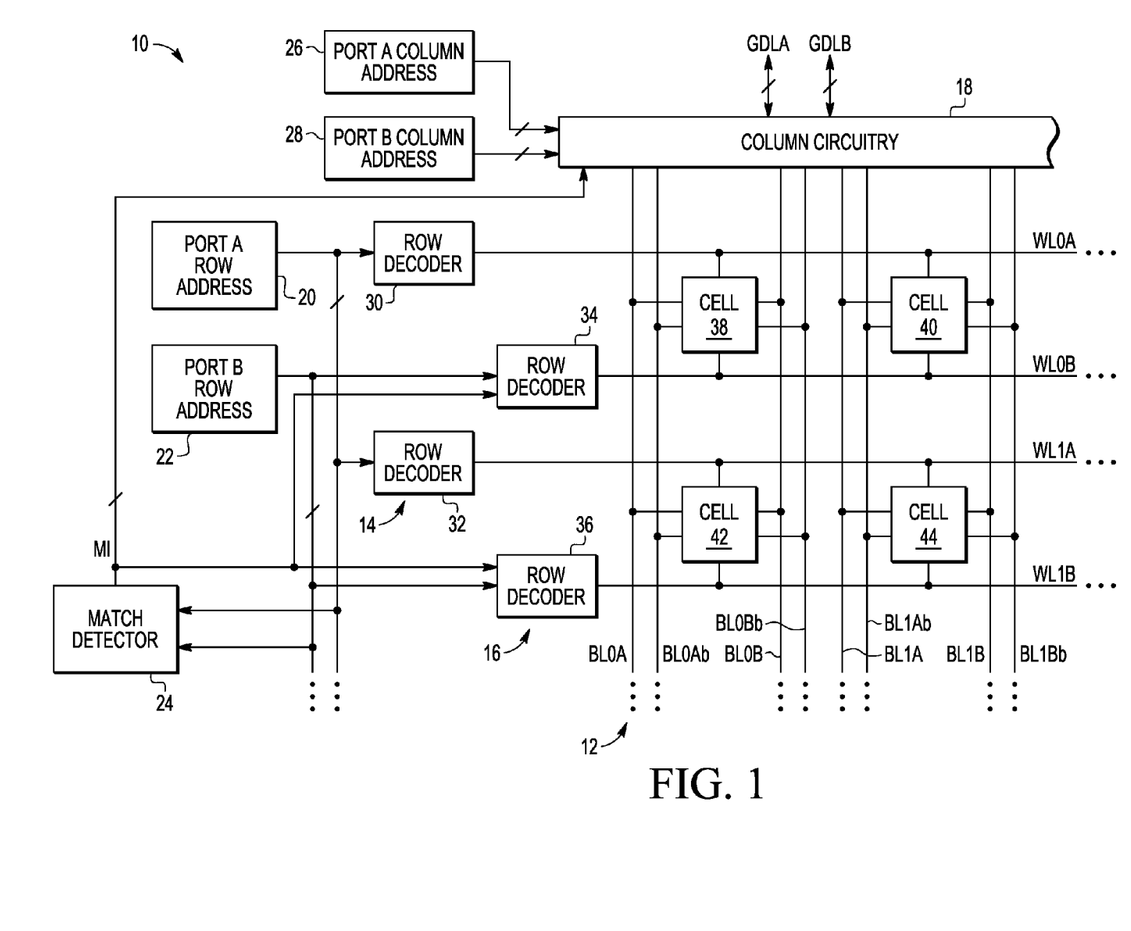
FIG. 1 is a block diagram of a multi-port memory according to an embodiment.

Shown in FIG. 1 is a memory 10 having an array 12, a port A row decoder 14, a port B row decoder 16, column circuitry 18, port A row address buffer 20, a port B row address buffer 22, a match detector 24, a port A column address buffer 26, and a port B column address buffer 28. Port A row decoder 14 comprises a row decoder 30 and a row decoder 32. Port B row decoder 16 comprises a row decoder 34 and a row decoder 36. Array 12 comprises bit cells 38, 40, 42, and 44.

Figure 3:
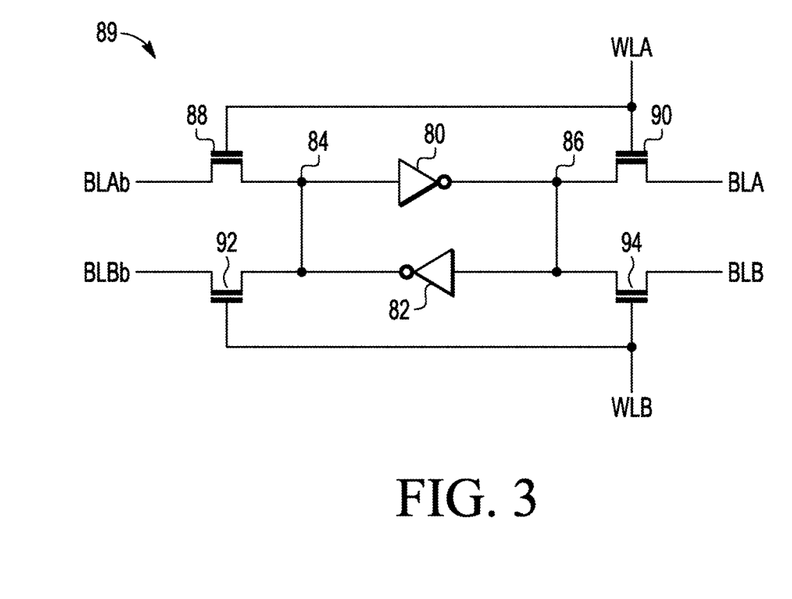
FIG. 3 is a circuit diagram of a memory cell of the multi-port memory of FIG. 1.

Shown in FIG. 3 is a circuit diagram of an exemplary memory cell 89 which is exemplary for the other bit cells of array 12 such as memory cells 38, 40, 42, and 44. Bit cell 38, which is a static random access memory (SRAM) cell, comprises inverters 80 and 82 connected to nodes 84 and 86 and transistors 88, 90, 92, and 94 which are N channel transistors in this example. Inverter 80 has an input connected to node 84 and an output connected to node 86. Inverter 82 has an input connected to node 86 and an output connected node 84. Nodes 84 and 86 are storage nodes of memory cell 38. Transistor 88 has a first current electrode connected to node 84, a control electrode connected to word line WLA which is a port A word line, and a second current electrode connected to bit line BLAb which is a complementary bit line of port A. Transistor 90 has a first current electrode connected to node 86, a control electrode connected to word line WLA, and a second current electrode connected to bit line BLA which is a true bit line of port A. Transistor 92 has a first current electrode connected to node 84, a control electrode connected to a word line WLB, which is a word line of port B, and a second current electrode connected to complementary bit line BLBb of port B. Transistor 94 has a first current electrode connected to node 86, a control electrode connected to word line WLB, and true bit line BLB of port B. Nodes 84 and 86 are storage nodes that are accessed through transistors 88 and 92 for node 84 and transistors 90 and 94 for node 86. Inverters 80 and 82 together may be considered a storage latch. Transistors 90 and 88 are enabled when memory cell 89 is selected by port A and for coupling the storage nodes to the port A bit line pair. Transistors 92 and 94 are enabled when memory cell 89 is selected by port B. If memory cell 89 is selected by both port A and port B, transistors 88 and 90 are enabled and transistors 92 and 94 are kept disabled by deselecting word line WLB so that bit lines BLBb and BLB are kept isolated from storage nodes 84 and 86. In this example the bit lines are used for either writing to storage nodes 84 and 86 or reading from storage nodes 84 and 86. The word lines are for enabling the coupling between storage nodes and bit lines. The control electrodes of transistors 88, 90, 92, and 94 may be considered enable inputs and the second current electrodes may be considered access nodes.

Array 12 includes more than the four bit cells, which may be called memory cells, shown as memory cells 38, 40, 42, and 44 in FIG. 1. Memory cells 38 and 40 have a first enable input connected to word line WL0A and a second enable input connected to word line WL0B. The access nodes for port A of memory cell 38 are connected to true and complementary bit lines BL0A and BL0Ab, and the access nodes for port B are connected to true and complementary bit lines BL0B and BL0Bb. The access nodes for port A of memory cell 40 are connected to true and complementary bit lines BL1A and BL1Ab, and the access nodes for port B are connected to true and complementary bit lines BL1B and BL1Bb. Memory cells 42 and 44 have a first enable input connected to word line WL0A and a second enable input connected to word line WL0B. The access nodes for port A of memory cell 42 are connected to true and complementary bit lines BL0A and BL0Ab and the access nodes for port B are connected to true and complementary bit lines BL0B and BL0Bb. The access nodes for port A of memory cell 44 are connected to true and complementary bit lines BL1A and BL1Ab, and the access nodes for port B are connected to true and complementary bit lines BL1B and BL1Bb. Port A row address buffer 20 provides true and complementary signals of row address signals for port A. Port B row address buffer 22 provides true and complementary signals of row address signals for port B. Row decoders 30 and 32 are coupled to the combination of true and complementary address signals for port A that when they are a logic high select word line WL0A and WL1A, respectively. Row decoders 34 and 36 are coupled to the combination of true and complementary address signals for port B that when they are a logic high select word line WL0B and WL1B, respectively. Match detector 24 is coupled to address buffers 20 and 22 and detects when they provide the same address and provides a true and a complement signal of a match indicator MI. When the row addresses for port A and port B are the same, that means that the selected word lines for port A and port B are for the same row. An example of this would be word lines WL0A and WL0B being selected. Column circuitry 18 is coupled to bit lines BL0A, BL0Ab, BL0B, BL0Bb, BL1A, BL1Ab, BL1B, and BL1Bb, selects among these bit lines, senses data at the selected bit lines, and couples the sensed data to global data lines GDLA for port A and GDLB for port B in response to column addresses provided by port A column address buffer 26 and port B column address buffer 28. True and complementary bit lines of the same port connected to the same column of cells may be referenced as a bit line pair. For example, bit lines BL0A and BL0Ab form a bit line pair. Similarly, data lines DLA and DLAb shown in FIG. 2 may be referenced as a data line pair.

Figure 2:
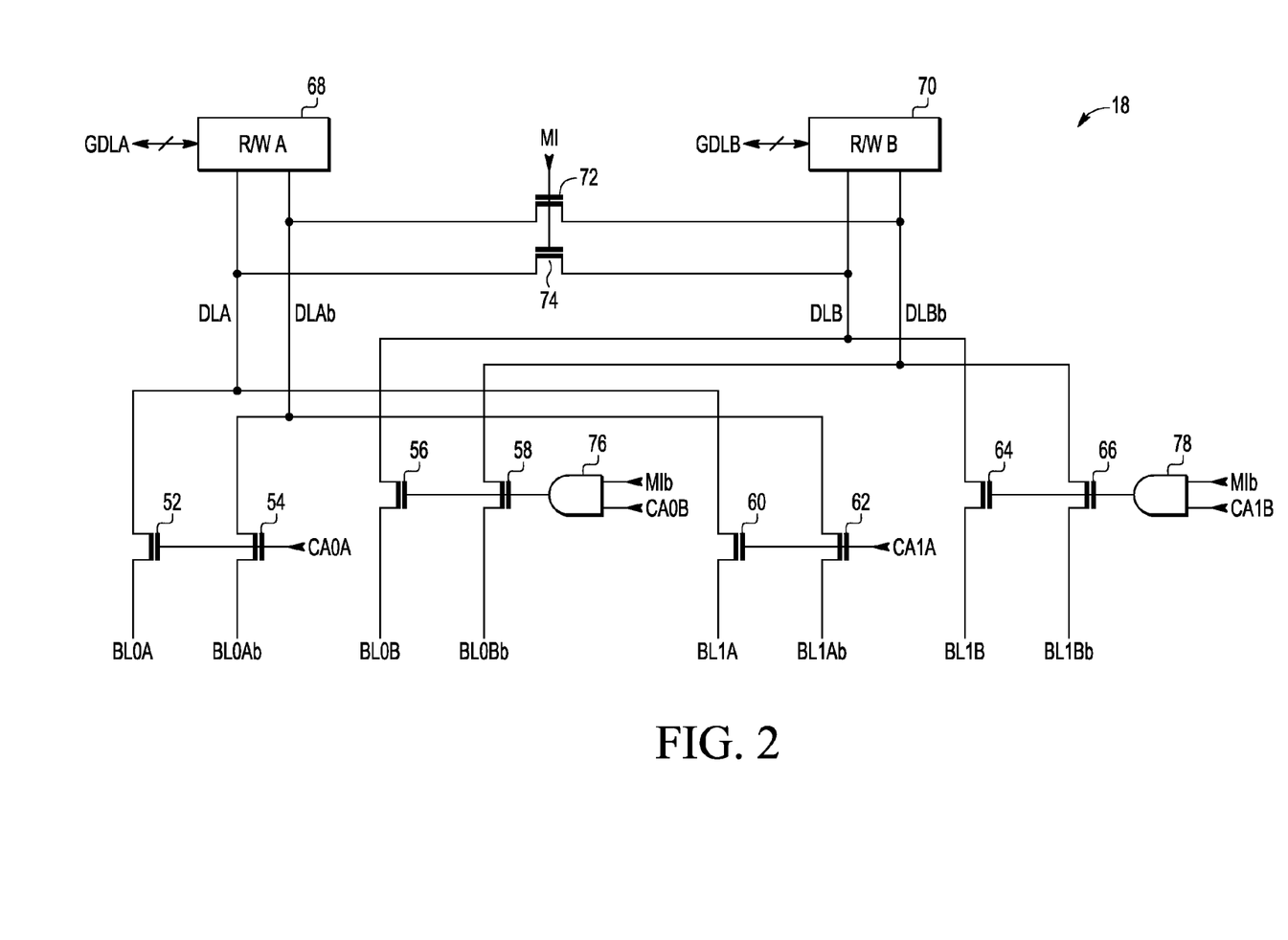
FIG. 2 is a combination circuit, logic, and block diagram of a portion of the multi-port memory of FIG. 1.

Shown in FIG. 2 is a column circuitry 18 in more detail. Column circuitry 18 comprises transistors 52, 54, 56, 58, 60, 62, 64, 66, a read/write (R/W) A buffer 68 for port A, a R/W buffer 70, an AND gate 76, and an AND gate 78. Transistor 52 has a first current electrode connected to bit line BL0A, a control electrode for receiving a column address CA0A for port A, and a second current electrode coupled to a true data line DLA for port A that is connected to R/W A buffer 68. Transistor 54 has a first current electrode connected to bit line BL0Ab, a control electrode for receiving column address CA0A, and a second current electrode connected to a complementary data line DLAb that is connected to R/W A buffer 68. Transistor 56 has a first current electrode connected to bit line BL0B, a control electrode connected to an output of AND gate 76, and a second current electrode coupled to a true data line DLB for port B that is connected to R/W B buffer 68 for port B. AND gate 76 has a first input for receiving a column address CA0B for port B and a second input for receiving a complementary match indicator MIb provided by match detector 24 when it detects that the port A and the port B row addresses are the same. Match indicator MI is a logic high when a match has been detected. Thus a logic low for complementary indicator MIb indicates that a match has been detected. When a match has not been detected, complementary indicator M1$b$ is a logic high so that column address signal CA0B for port B is passed to the control gate of transistor 58. Transistor 58 has a first current electrode connected to bit line BL0Bb, a control electrode connected to the output of AND gate 76, and a second current electrode coupled to a complementary data line DLBb for port B that is connected to R/W B buffer 70 for port B. Transistor 60 has a first current electrode connected to bit line BL1A, a control electrode for receiving a column address CA1A for port A, and a second current electrode coupled to true data line DLA for port A that is connected to R/W A buffer 68. Transistor 62 has a first current electrode connected to bit line BL1Ab, a control electrode for receiving column address CA1A, and a second current electrode connected to complementary data line DLAb that is connected to R/W A buffer 68. Transistor 64 has a first current electrode connected to bit line BL1B, a control electrode connected to an output of AND gate 78, and a second current electrode coupled to true data line DLB for port B that is connected to R/W B buffer 70 for port B. AND gate 76 has a first input for receiving a column address CA1B for port B and a second input for receiving complementary match indicator MIb provided by match detector 24 when it detects that the port A and the port B row addresses are the same. As previously described for complementary match signal MIb, when a match has not been detected, complementary indicator M1$b$ is a logic high so that column address signal CA1B for port B is passed to the control gate of transistor 64. Transistor 66 has a first current electrode connected to bit line BL1Bb, a control electrode connected to the output of AND gate 78, and a second current electrode coupled to a complementary data line DL1Bb for port B that is connected to R/W B buffer 70 for port B. Transistor 72 has a first current electrode coupled to complementary data line for port A, DLAb, a control gate coupled to match indicator signal MI, and a second current electrode coupled to complementary data line for port B, DLBb. Transistor 74 has a first current electrode coupled to true data line for Port A, DLA, a gate electrode coupled the match indicator signal MI, and a second current electrode coupled to true data line for Port B, DLB.

For a read, data present on the bit lines is selectively coupled to data line pair DLA and DLAb and data line pair DLB and DLBb. The selection is made by column address signals CA0A and CA1A for port A and column address signals Ca0B and CA1B for port B. R/W A buffer 68 and R/W B buffer 70 each include a sensing circuit and a write driver. For a read, R/W A buffer 68 and R/W B buffer 70 sense the data present on data line pair DLA and DLBb and data line pair DLB and DLBb, respectively. After sensing, the data is provided on global data lines GDLA and GDLB. For writing, data is received on global data lines GDLA and GDLB. The data is then written by the write drivers for R/W A buffer 68 and R/W B buffer 70 onto data line pair DLA and DLAb and data line pair DLB and DLBb, respectively. The bit lines are selected for a write in the same manner as for a read. In this example, the selection is a one to two selection. The bit line pair associated with a column address is the bit line pair selected for normal operation in which the row addresses for port A and B are different. For port A, column address CA0A is associated with bit line pair BL0A and BL0Ab, and column address CA1A is associated with bit line pair BL1A and BL1Ab. For port B, column address CA0B is associated with bit line pair BL0B and BL0Bb, and column address CA1B is associated with bit line pair BL1B and BL1Bb.

For normal operation in which the row addresses are different, match detector 24 detects that there is not a match so that port A and port B address buffers provide the respective row address signals to the port A and port B row decoders. Thus, for example, row decoder 30, a port A row decoder, may respond by enabling word line WL0A and row decoder 36, a port B row decoder, may respond by enabling word line WL1B. The port A bit line pairs are then coupled to the storage nodes of the memory cells along the row of memory cells connected to word lines WL0A and WL0B. Similarly, the port B bit line pairs are coupled to the storage nodes of the memory cells along the row of memory cells connected to word lines WL1A and WL1B. In such case then, port A can read or write selected memory cells along the row connected to word lines WL0A and WL1A, and port B can read or write selected memory cells along the row connected to word lines WL0B and WL1B. Since the row addresses are different, the match indicator MI is not asserted so that true match indicator signal MI is a logic low which has the effect of transistors 72 and 74 being non-conductive. Complementary match indicator signal MIb is at a logic high in this case of the row addresses being different, so that the outputs of AND gates 76 and 78 are the same as the column address signals CA0B and CA1B, respectively. In such case the port A and port B operations have little if any impact on the other. Only one pair of bit lines is coupled to the storage nodes of any given memory cell along the selected rows. On the other hand, if the row addresses are the same, the operation is treated differently to avoid having the storage nodes of memory cells being coupled to two pairs of bit lines.

For the case where the row addresses for port A and port B are the same, match detector 24 detects that they are the same and asserts match indicator MI to port A and port B row decoders 34 and 36 and to column circuitry 18. Port B row decoders 34 and 36 respond by disabling their outputs so that no port B word lines are enabled. Thus for example, if row decoders 30 and 34 are selected by the port A and port B row address, row decoder 30 will be selected and enable word line WL0A, but row decoder 34 will not be enabled and word line WL0B will not be enabled. With word line WL0B not enabled the storage nodes of the memory cells along the selected row, memory cells 38 and 40 for example, will not be coupled to the port B bit line pairs. Thus, the capacitance of the port B bit line pairs will not be added to the capacitance of the port A bit line pairs that are coupled to the storage nodes of the memory cells along the selected row. Additionally, bit cell instability caused by coupling more than one bit line pair to a common bit cell is avoided. Also the port B bit line pairs are decoupled from the data lines. AND gates 76 and 78 receive complementary match indicator signal MIb which is a logic low when there is a row address match so that AND gates 76 and 78 output a logic low regardless of the logic state of the column address signals CA0B and CA1B. Thus transistors 58 and 64 are non-conductive which keeps bit line pair BL0B and BL0Bb and bit line pair BL1B and BL1Bb decoupled from data line pair DLB and DLBb. With true match indicator signal MI being a logic high, transistors 72 and 74 are conductive which has the effect of coupling data line pair DLA and DLAb to data line pair DLB and DLBb together. This allows for sensing and writing to be achieved by either or both of R/W A and R/W B buffers 68 and 70. Thus the flexibility of reading and writing through port A and port B is not sacrificed while the capacitance of the port B bit line pairs is not added to the capacitance of the port A bit line pairs. This is particularly important for reading where the primary load is bit line capacitance and the drive capability of the memory cells is relatively low to keep the cell size low. Bit line capacitance is very significant in the design of sensing and increase sense time significantly. An aggressive sensing design and cell size could risk flipping the state of the cell if more than one of the bit line pairs is selected by multiple ports. Accordingly, it is seen that the capacitance doubling problem and bit cell stability problems are avoided while retaining the flexibility of reading and writing from both ports while using the same pair of bit lines for both reading and writing.

By now it should be appreciated that there has been provided a multiple port static random access memory (SRAM) that includes a first word line and a second word line of a plurality of word lines. The multiple port SRAM further includes a first bit line pair, a second bit line pair, a third bit line pair, and a fourth bit line pair of a plurality of bit line pairs. The multiple port SRAM further includes an array of bit cells coupled to the plurality of word lines and the plurality of bit line pairs in which the array of bit cells includes a first bit cell having a first storage latch, and coupled to the first word line and the first bit line pair to access a first storage latch, and coupled to the second word line and the second bit line pair to access the first storage latch and a second bit cell having a second storage latch, and coupled to the first word line and the third bit line pair to access a second storage latch, and coupled to the second word line and the fourth bit line pair to access the second storage latch. The multiple port SRAM further includes a first read/write data line pair of a first plurality of read/write data line pairs for accessing the array of bit cells, and a second read/write data line pair of a second plurality of read/write data line pairs for accessing the array of bit cells in which the first read/write data line pair is coupled to the first bit line pair via first switching logic and coupled to the third bit line pair via second switching logic and the second read/write data line pair is coupled to the second bit line pair via third switching logic and coupled to the fourth bit line pair via fourth switching logic. The multiple port SRAM further includes a match detector which provides a match indicator based on whether at least a portion of a first access address matches at least a portion of a second access address, and in response to the match indicator indicating a match, a state of the third and forth switching logic is set such that the second bit line pair and the fourth bit line pair remains decoupled from the second read/write data line pair. The multiple port SRAM may further include coupling circuitry, wherein, in response to the match indicator indicating a match, the coupling circuitry couples true data lines of the first and second read/write data line pairs with each other and couples complementary data lines of the first and second read/write data line pairs with each other. The multiple port SRAM may have a further characterization by which the coupling circuitry includes a first transistor having a first current electrode connected to the true data line of the first read/write data line pair, a second current electrode connected to the true data line of second read/write data line pair, and control electrode coupled to receive the match indicator and a second transistor having a first current electrode connected to the complementary data line of the first read/write data line pair, a second current electrode connected to the complementary data line of second read/write data line pair, and control electrode coupled to receive the match indicator. The multiple port SRAM may further include column decode circuitry which provides a first column decode output in response to the first access address and provides a second column decode output in response to the second access address. The multiple port SRAM may have a further characterization by which, in response to the match indicator not indicating a match, the state of the first and second switching logic is determined by the first column decode output such that one of the first and second bit cells is accessed by the first read/write data line pair, and the state of the third and fourth switching logic is determined by the second column decode output such that one of the first and second bit cells is access by the second read/write data line pair. The multiple port SRAM may have a further characterization by which, in response to the match indicator indicating a match, the state of the first and second switching logic is determined by the first column decode output and the state of the third and fourth switching logic is set such that the second bit line pair and the fourth bit line pair remains decoupled from the second data line pair, regardless of a value of the second column decode output. The multiple port SRAM may further include first read/write circuitry coupled to the first data line pair such that when the first word line is selected, the first data line pair accesses one of the first or second bit cell based on a state of the first and second switching logic and second read/write circuitry coupled to the second data line pair such that, when the second word line is selected and the match indicator does not indicate a match, the second data line pair accesses one of the first or second bit cell based on a state of the third and fourth switching logic. The multiple port SRAM may further include first row decode circuitry coupled to a first subset of the plurality of word lines, including the first word line, wherein the first row decode circuitry activates a word line of the first subset based on the first access address and second row decode circuitry coupled to a second subset of the plurality of word lines, including the second word line, wherein the first subset and the second subset are mutually exclusive. The multiple port SRAM may have a further characterization by which, when the match indicator does not indicate a match, the second row decode circuitry activates a word line of the second subset based on the second access address and when the match indicator indicates a match, the second row decode circuitry is disabled, in which the second word line is disabled. The multiple port SRAM may have a further characterization by which the at least a portion of the first access address is characterized as a first row address derived from the first access address, and the at least a portion of the second access address is characterized as a second row address derived from the second access address. The multiple port SRAM may have a further characterization by which, when the match indicator does not indicate a match, the first plurality of read/write data lines access a first set of bit cells of the array of bit cells is response to the first access address, and the second plurality of read/write data lines access a second set of bit cells of the array of bit cells, mutually exclusive of the first set of bit cell, in response to the second access address. The multiple port SRAM may have a further characterization by which the access of the first plurality of read/write data lines occurs simultaneously with the access of the second plurality of read/write data lines.

Disclosed also is a method for accessing a multiple port static random access memory (SRAM) having a plurality of word lines, a plurality of bit line pairs, and a plurality of bit cells coupled to the plurality of word lines and the plurality of bit line pairs, wherein each of the plurality of bit cells is coupled to a first bit line pair and a second bit line pair of the plurality of bit line pairs and a first word line and a second word line of the plurality of word lines. The method includes providing a first access address and a second access address to the multiple port SRAM. The method further includes providing a match indicator based on a comparison between at least a portion of the first access address and at least a portion of the second access address. The method further includes if the match indicator indicates a match deactivating the second word line for each bit cell of the plurality of bit cells and for each bit cell selected by the first access address, using a first read/write data line pair of the multiple port SRAM to access the bit cell using the first bit line pair and first word line, while decoupling the second bit line pair of the bit cell from a second read/write data line pair of the multiple port SRAM. The method may further include, if the match indicator indicates a match, coupling a true read/write data line of the first read/write data line pair to a true read/write data line of the second read/write data line pair and coupling a complementary read/write data line of the first read/write data line pair to a complementary read/write data line of the second read/write data line pair. The method may further include, if the match indicator does not indicate a match, for each bit cell selected by the first access address, using the first read/write data line pair to perform a read or write access to the bit cell and for each bit cell selected by the second access address, using the second read/write data line pair to perform a read or write access to the bit cell.

Also disclosed is a multiple port SRAM including a a first bit cell having a first storage latch, and coupled to a first word line, a first true bit line, and a first complementary bit line to access the storage latch, and coupled to a second word line, a second true bit line, and a second complementary bit line to access the first storage latch. The multiple port SRAM further includes a second bit cell having a second storage latch, and coupled to the first word line, a third true bit line, and a third complementary bit line to access the second storage latch, and coupled to the second word line, a fourth true bit line, and a fourth complementary bit line to access the second storage latch. The multiple port SRAM further includes a first data line pair, wherein the first true bit line and first complementary bit line and third bit line and third complementary bit line are coupled to the first data line pair via first column decode circuitry that is responsive to a first access address. The multiple port SRAM further includes a second data line pair, wherein the second true bit line and the second complementary bit line and fourth bit line and fourth complementary bit line are coupled to the second data line pair via second column decode circuitry that is responsive to a second access address. The multiple port SRAM further includes a match detector which provides a match indicator based on whether a first row address derived from the first access address matches a second row address derived from the second access address. The multiple port SRAM further includes decoupling logic which, in response to the match indicator indicating a match, overrides the second column decode circuitry such that second true bit line and second complementary bit line remains decoupled from the second data line pair and the fourth true bit line and the fourth complementary bit line remains decoupled from the second data line pair. The multiple port SRAM may further include coupling circuitry coupled between the first data line pair and the second data line pair, wherein, in response to the match indicator indicating a match, the coupling circuitry couples true data lines of the first and second read/write data line pairs with each other and short complementary data line of the first and second read/write data line pairs with each other. The multiple port SRAM may have a further characterization by which, in response to the match indicator not indicating a match, the first column decode circuitry selects either the first true and complementary bit lines or the third true and complementary bit lines to couple to the first data line pair based on the first access address, and the second column decode circuitry selects either the second true and complementary bit line or the fourth true and complementary bit lines to couple to the second data line pair based on the second access address. The multiple port SRAM may further include first read/write circuitry coupled to the first data line pair such that when the first word line is selected, the first data line pair can read data from or write data to one of the first or second bit cell and second read/write circuitry coupled to the second data line pair such that, when the second word line is selected and the match indicator does not indicate a match, the second data line pair can read data from or write data to one of the first or second bit cell. The multiple port SRAM may further include first row decode circuitry coupled to the first word line, wherein the first row decode circuitry selective activates the first word line based on the first access address and second row decode circuitry coupled to the second word line, wherein, when the match indicator indicates a match, the second row decode circuitry is deactivated so as to deactivate the second word line, regardless of a value of the second access address and when the match indicator does not indicate a match, the second row decode circuitry selectively activates the second word line based on the second access address.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. For example the invention was described in the context of two ports, it may be applied to memory architectures in which there are more than two ports. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multiple port static random access memory (SRAM), comprising:
    a first word line and a second word line of a plurality of word lines;
    a first bit line pair, a second bit line pair, a third bit line pair, and a fourth bit line pair of a plurality of bit line pairs;
    an array of bit cells coupled to the plurality of word lines and the plurality of bit line pairs, wherein the array of bit cells comprises:
        a first bit cell having a first storage latch, and coupled to the first word line and the first bit line pair to access a first storage latch, and coupled to the second word line and the second bit line pair to access the first storage latch; and
        a second bit cell having a second storage latch, and coupled to the first word line and the third bit line pair to access a second storage latch, and coupled to the second word line and the fourth bit line pair to access the second storage latch;
    a first read/write data line pair of a first plurality of read/write data line pairs for accessing the array of bit cells, and a second read/write data line pair of a second plurality of read/write data line pairs for accessing the array of bit cells, wherein:
        the first read/write data line pair is coupled to the first bit line pair via first switching logic and coupled to the third bit line pair via second switching logic; and
        the second read/write data line pair is coupled to the second bit line pair via third switching logic and coupled to the fourth bit line pair via fourth switching logic; and
    a match detector which provides a match indicator based on whether at least a portion of a first access address matches at least a portion of a second access address, and in response to the match indicator indicating a match, a state of the third and forth switching logic is set such that the second bit line pair and the fourth bit line pair remains decoupled from the second read/write data line pair.

2. The multiple port SRAM of claim 1, further comprising:
    coupling circuitry, wherein, in response to the match indicator indicating a match, the coupling circuitry couples true data lines of the first and second read/write data line pairs with each other and couples complementary data lines of the first and second read/write data line pairs with each other.

3. The multiple port SRAM of claim 2, wherein the coupling circuitry comprises:
    a first transistor having a first current electrode connected to the true data line of the first read/write data line pair, a second current electrode connected to the true data line of second read/write data line pair, and control electrode coupled to receive the match indicator; and
    a second transistor having a first current electrode connected to the complementary data line of the first read/write data line pair, a second current electrode connected to the complementary data line of second read/write data line pair, and control electrode coupled to receive the match indicator.

4. The multiple port SRAM of claim 1, further comprising:
    column decode circuitry which provides a first column decode output in response to the first access address and provides a second column decode output in response to the second access address.

5. The multiple port SRAM of claim 4, wherein, in response to the match indicator not indicating a match, the state of the first and second switching logic is determined by the first column decode output such that one of the first and second bit cells is accessed by the first read/write data line pair, and the state of the third and fourth switching logic is determined by the second column decode output such that one of the first and second bit cells is access by the second read/write data line pair.

6. The multiple port SRAM of claim 4, wherein, in response to the match indicator indicating a match, the state of the first and second switching logic is determined by the first column decode output and the state of the third and fourth switching logic is set such that the second bit line pair and the fourth bit line pair remains decoupled from the second data line pair, regardless of a value of the second column decode output.

7. The multiple port SRAM of claim 1, further comprising:
    first read/write circuitry coupled to the first data line pair such that when the first word line is selected, the first data line pair accesses one of the first or second bit cell based on a state of the first and second switching logic; and second read/write circuitry coupled to the second data line pair such that, when the second word line is selected and the match indicator does not indicate a match, the second data line pair accesses one of the first or second bit cell based on a state of the third and fourth switching logic.

8. The multiple port SRAM of claim 1, further comprising:
first row decode circuitry coupled to a first subset of the plurality of word lines, including the first word line, wherein the first row decode circuitry activates a word line of the first subset based on the first access address; and
second row decode circuitry coupled to a second subset of the plurality of word lines, including the second word line, wherein the first subset and the second subset are mutually exclusive.

9. The multiple port SRAM of claim 8, wherein:
when the match indicator does not indicate a match, the second row decode circuitry activates a word line of the second subset based on the second access address, and
when the match indicator indicates a match, the second row decode circuitry is disabled, in which the second word line is disabled.

10. The multiple port SRAM of claim 1, wherein the at least a portion of the first access address is characterized as a first row address derived from the first access address, and the at least a portion of the second access address is characterized as a second row address derived from the second access address.

11. The multiple port SRAM of claim 1, wherein, when the match indicator does not indicate a match, the first plurality of read/write data lines access a first set of bit cells of the array of bit cells is response to the first access address, and the second plurality of read/write data lines access a second set of bit cells of the array of bit cells, mutually exclusive of the first set of bit cell, in response to the second access address.

12. The multiple port SRAM of claim 11, wherein the access of the first plurality of read/write data lines occurs simultaneously with the access of the second plurality of read/write data lines.

13. A method for accessing a multiple port static random access memory (SRAM) having a plurality of word lines, a plurality of bit line pairs, and a plurality of bit cells coupled to the plurality of word lines and the plurality of bit line pairs, wherein each of the plurality of bit cells is coupled to a first bit line pair and a second bit line pair of the plurality of bit line pairs and a first word line and a second word line of the plurality of word lines, the method comprising:
providing a first access address and a second access address to the multiple port SRAM;
providing a match indicator based on a comparison between at least a portion of the first access address and at least a portion of the second access address;
if the match indicator indicates a match:
deactivating the second word line for each bit cell of the plurality of bit cells; and
for each bit cell selected by the first access address, using a first read/write data line pair of the multiple port SRAM to access the bit cell using the first bit line pair and first word line, while decoupling the second bit line pair of the bit cell from a second read/write data line pair of the multiple port SRAM.

14. The method of claim 13, wherein if the match indicator indicates a match, the method further comprises:
coupling a true read/write data line of the first read/write data line pair to a true read/write data line of the second read/write data line pair; and
coupling a complementary read/write data line of the first read/write data line pair to a complementary read/write data line of the second read/write data line pair.

15. The method of claim 13, wherein, if the match indicator does not indicate a match, the method comprises:
for each bit cell selected by the first access address, using the first read/write data line pair to perform a read or write access to the bit cell; and
for each bit cell selected by the second access address, using the second read/write data line pair to perform a read or write access to the bit cell.

16. A multiple port static random access memory (SRAM), comprising:
a first bit cell having a first storage latch, and coupled to a first word line, a first true bit line, and a first complementary bit line to access the storage latch, and coupled to a second word line, a second true bit line, and a second complementary bit line to access the first storage latch;
a second bit cell having a second storage latch, and coupled to the first word line, a third true bit line, and a third complementary bit line to access the second storage latch, and coupled to the second word line, a fourth true bit line, and a fourth complementary bit line to access the second storage latch;
a first data line pair, wherein the first true bit line and first complementary bit line and third bit line and third complementary bit line are coupled to the first data line pair via first column decode circuitry that is responsive to a first access address;
a second data line pair, wherein the second true bit line and the second complementary bit line and fourth bit line and fourth complementary bit line are coupled to the second data line pair via second column decode circuitry that is responsive to a second access address;
a match detector which provides a match indicator based on whether a first row address derived from the first access address matches a second row address derived from the second access address; and
decoupling logic which, in response to the match indicator indicating a match, overrides the second column decode circuitry such that second true bit line and second complementary bit line remains decoupled from the second data line pair and the fourth true bit line and the fourth complementary bit line remains decoupled from the second data line pair.

17. The multiple port SRAM of claim 16, further comprising:
coupling circuitry coupled between the first data line pair and the second data line pair, wherein, in response to the match indicator indicating a match, the coupling circuitry couples true data lines of the first and second read/write data line pairs with each other and short complementary data line of the first and second read/write data line pairs with each other.

18. The multiple port SRAM of claim 16, wherein, in response to the match indicator not indicating a match, the first column decode circuitry selects either the first true and complementary bit lines or the third true and complementary bit lines to couple to the first data line pair based on the first access address, and the second column decode circuitry selects either the second true and complementary bit line or the fourth true and complementary bit lines to couple to the second data line pair based on the second access address.

19. The multiple port SRAM of claim 16, further comprising:
   first read/write circuitry coupled to the first data line pair such that when the first word line is selected, the first data line pair can read data from or write data to one of the first or second bit cell; and
   second read/write circuitry coupled to the second data line pair such that, when the second word line is selected and the match indicator does not indicate a match, the second data line pair can read data from or write data to one of the first or second bit cell.

20. The multiple port SRAM of claim 16, further comprising:
   first row decode circuitry coupled to the first word line, wherein the first row decode circuitry selective activates the first word line based on the first access address; and
   second row decode circuitry coupled to the second word line, wherein:
      when the match indicator indicates a match, the second row decode circuitry is deactivated so as to deactivate the second word line, regardless of a value of the second access address; and
      when the match indicator does not indicate a match, the second row decode circuitry selectively activates the second word line based on the second access address.

\* \* \* \* \*